United States Patent
Ku et al.

(10) Patent No.: US 10,934,426 B2
(45) Date of Patent: Mar. 2, 2021

(54) METHOD FOR PRODUCING A POLYMER FILM BY USING A POLYMER COMPOSITION

(71) Applicant: LG Chem, Ltd., Seoul (KR)

(72) Inventors: Se Jin Ku, Daejeon (KR); Mi Sook Lee, Daejeon (KR); Hyung Ju Ryu, Daejeon (KR); Sung Soo Yoon, Daejeon (KR); No Jin Park, Daejeon (KR); Jung Keun Kim, Daejeon (KR); Je Gwon Lee, Daejeon (KR); Eun Young Choi, Daejeon (KR)

(73) Assignee: LG Chem, Ltd.

( * ) Notice: Subject to any disclaimer, the term of this patent is extended or adjusted under 35 U.S.C. 154(b) by 0 days.

(21) Appl. No.: 16/461,204

(22) PCT Filed: Nov. 29, 2017

(86) PCT No.: PCT/KR2017/013833
§ 371 (c)(1),
(2) Date: May 15, 2019

(87) PCT Pub. No.: WO2018/101742
PCT Pub. Date: Jun. 7, 2018

(65) Prior Publication Data
US 2019/0276658 A1 Sep. 12, 2019

(30) Foreign Application Priority Data
Nov. 30, 2016 (KR) .................. 10-2016-0162139

(51) Int. Cl.
| | | |
|---|---|---|
| *C08L 53/00* | (2006.01) | |
| *C08J 5/18* | (2006.01) | |
| *C08J 7/12* | (2006.01) | |
| *C08J 5/22* | (2006.01) | |
| *C08F 220/38* | (2006.01) | |
| *C08F 220/22* | (2006.01) | |
| *C09D 153/00* | (2006.01) | |
| *C08F 293/00* | (2006.01) | |
| *C08F 228/02* | (2006.01) | |
| *C08F 220/18* | (2006.01) | |
| *H01L 21/027* | (2006.01) | |
| *B82Y 40/00* | (2011.01) | |
| *G03F 1/00* | (2012.01) | |
| *H01L 21/311* | (2006.01) | |
| *H01L 21/308* | (2006.01) | |

(52) U.S. Cl.
CPC .............. *C08L 53/00* (2013.01); *B82Y 40/00* (2013.01); *C08F 220/18* (2013.01); *C08F 220/22* (2013.01); *C08F 220/38* (2013.01); *C08F 228/02* (2013.01); *C08F 293/005* (2013.01); *C08J 5/18* (2013.01); *C08J 5/22* (2013.01); *C08J 7/12* (2013.01); *C09D 153/00* (2013.01); *G03F 1/00* (2013.01); *H01L 21/027* (2013.01); *H01L 21/311* (2013.01); *C08F 2438/03* (2013.01); *C08J 2353/00* (2013.01); *C08J 2453/00* (2013.01); *C08L 2203/16* (2013.01); *C08L 2205/025* (2013.01); *C08L 2205/03* (2013.01); *C08L 2205/14* (2013.01); *H01L 21/0271* (2013.01); *H01L 21/3081* (2013.01); *H01L 21/31127* (2013.01)

(58) Field of Classification Search
CPC ... C08L 53/00; C09D 153/00; C08F 293/005; B82Y 40/00
USPC .......................................................... 525/89
See application file for complete search history.

(56) References Cited

U.S. PATENT DOCUMENTS

| | | | |
|---|---|---|---|
| 2010/0159214 A1 | 6/2010 | Hasegawa et al. | |
| 2010/0323096 A1 | 12/2010 | Sills et al. | |
| 2011/0059299 A1 | 3/2011 | Kim et al. | |
| 2013/0209694 A1* | 8/2013 | Chang .................... | B05D 3/02 427/379 |
| 2013/0209696 A1 | 8/2013 | Sharma et al. | |
| 2015/0072291 A1 | 3/2015 | Cho et al. | |
| 2015/0073096 A1 | 3/2015 | Navarro et al. | |
| 2015/0093507 A1* | 4/2015 | Kurosawa ........... | C09D 183/10 427/261 |
| 2015/0098077 A1* | 4/2015 | Findlay ................. | G01K 11/32 356/73.1 |
| 2015/0376408 A1* | 12/2015 | Zhang ............... | H01L 21/31116 216/49 |
| 2016/0251539 A1* | 9/2016 | Hustad ................. | C09D 153/00 427/385.5 |
| 2017/0210938 A1 | 7/2017 | Ku et al. | |
| 2017/0219922 A1 | 8/2017 | Ku et al. | |

FOREIGN PATENT DOCUMENTS

| | | |
|---|---|---|
| CN | 103304950 A | 9/2013 |
| CN | 103319835 A | 9/2013 |
| JP | 2005008701 A | 1/2005 |
| JP | 2010144120 A | 7/2010 |

(Continued)

OTHER PUBLICATIONS

International Search report for PCT/KR2017/013833 dated Feb. 22, 2018.

*Primary Examiner* — Jeffrey C Mullis
(74) *Attorney, Agent, or Firm* — Lerner, David, Littenberg, Krumholz & Mentlik, LLP

(57) ABSTRACT

The present disclosure relates to a polymer composition and a use thereof to produce a polymer film. Such a polymer composition provides excellent self-assembly properties and is capable of forming a vertical orientation structure in a short time even on a surface where no neutral treatment is performed.

13 Claims, 1 Drawing Sheet

(56) References Cited

FOREIGN PATENT DOCUMENTS

| | | |
|---|---|---|
| JP | 2015061905 A | 4/2015 |
| JP | 2015070054 A | 4/2015 |
| JP | 2017537458 A | 12/2017 |
| KR | 20120014214 A | 2/2012 |
| KR | 20130092490 A | 8/2013 |
| KR | 20130092505 A | 8/2013 |
| KR | 20130138399 A | 12/2013 |
| KR | 101412228 B1 | 7/2014 |
| KR | 20160031386 A | 3/2016 |
| KR | 20160038710 A | 4/2016 |
| KR | 20160038869 A | 4/2016 |
| KR | 101723886 B1 | 4/2017 |
| WO | 2016053014 A1 | 4/2016 |

\* cited by examiner

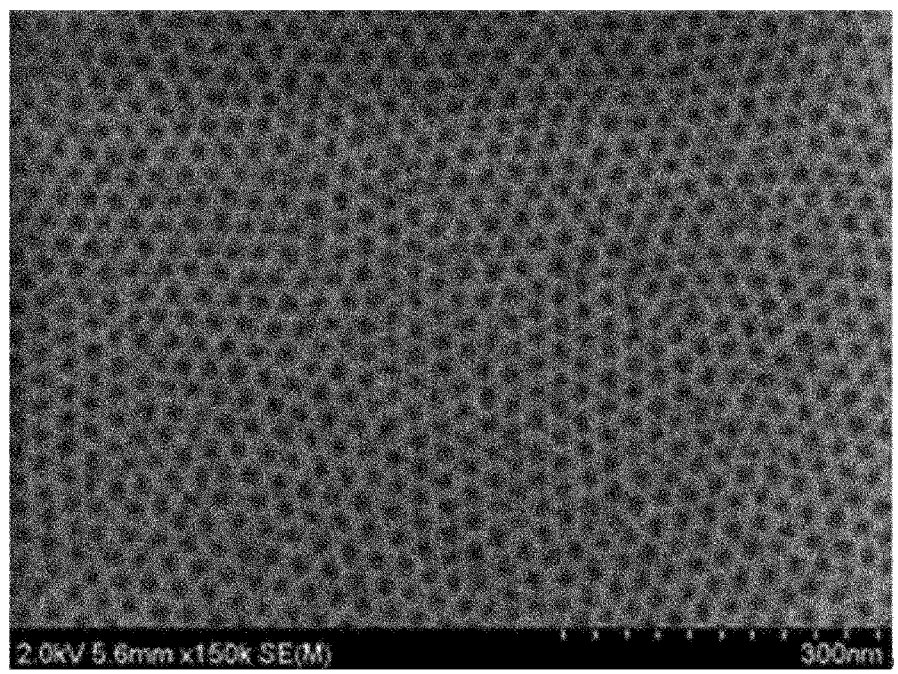

METHOD FOR PRODUCING A POLYMER FILM BY USING A POLYMER COMPOSITION

CROSS-REFERENCE TO RELATED APPLICATIONS

The present application is a national phase entry under 35 U.S.C. § 371 of International Application No. PCT/KR2017/013833 filed Nov. 29, 2017, which claims priority from Korean Patent Application No. 10-2016-0162139 filed Nov. 30, 2016.

TECHNICAL FIELD

The present application relates to a polymer composition and a use thereof.

BACKGROUND ART

A block copolymer has a molecular structure in which polymer blocks having different chemical structures are linked via covalent bonds. The block copolymer can form a periodically arranged structure such as a sphere, a cylinder or a lamella by phase separation. The domain shape and size of the structure formed by a self-assembly phenomenon of the block copolymer can be extensively controlled by, for example, the kind of the monomer forming each block or the relative ratios between the blocks, and the like.

Due to these properties, the block copolymer is being considered for application to nanowire production, production of various next-generation nano devices such as quantum dots or metal dots, or a lithography method capable of forming high-density patterns on a predetermined substrate, and the like.

The technique of adjusting orientation of the self-assembled structure of the block copolymer horizontally or vertically on various substrates occupies a very large proportion in practical application of the block copolymer. Typically, the orientation of nanostructures in the film of the block copolymer is determined by which block of the block copolymer is exposed to the surface or air. In general, since a number of substrates have polarity and air is non-polar, a block having a larger polarity among the blocks of the block copolymer is wetted to the substrate, and a block having a smaller polarity is wetted at the interface with air. Therefore, there is a demand for a technique such that the blocks having different characteristics of the block copolymer are simultaneously wetted to the substrate side.

DISCLOSURE

Technical Problem

The present application provides a polymer composition.

Technical Solution

In this specification, the term alkyl group may mean an alkyl group having 1 to 20 carbon atoms, 1 to 16 carbon atoms, 1 to 12 carbon atoms, 1 to 8 carbon atoms or 1 to 4 carbon atoms, unless otherwise specified. The alkyl group may be a linear, branched or cyclic alkyl group, which may be optionally substituted with one or more substituents.

In this specification, the term alkoxy group may mean an alkoxy group having 1 to 20 carbon atoms, 1 to 16 carbon atoms, 1 to 12 carbon atoms, 1 to 8 carbon atoms or 1 to 4 carbon atoms, unless otherwise specified. The alkoxy group may be a linear, branched or cyclic alkoxy group, which may be optionally substituted with one or more substituents.

The term alkenyl group or alkynyl group herein means an alkenyl group or alkynyl group having 2 to 20 carbon atoms, 2 to 16 carbon atoms, 2 to 12 carbon atoms, 2 to 8 carbon atoms or 2 to 4 carbon atoms, unless otherwise specified. The alkenyl or alkynyl group may be linear, branched or cyclic, which may be optionally substituted with one or more substituents.

The term alkylene group herein may mean an alkylene group having 1 to 20 carbon atoms, 1 to 16 carbon atoms, 1 to 12 carbon atoms, 1 to 8 carbon atoms or 1 to 4 carbon atoms, unless otherwise specified. The alkylene group may be a linear, branched or cyclic alkylene group, which may be optionally substituted with one or more substituents.

The term alkenylene group or alkynylene group herein may mean an alkenylene group or alkynylene group having 2 to 20 carbon atoms, 2 to 16 carbon atoms, 2 to 12 carbon atoms, 2 to 8 carbon atoms or 2 to 4 carbon atoms. The alkenylene group or alkynylene group may be linear, branched or cyclic, which may be optionally substituted with one or more substituents.

The term aryl group or arylene group herein may mean, unless otherwise specified, a monovalent residue or divalent residue derived from a compound comprising one benzene structure, or a structure in which two or more benzene rings are linked while sharing one or two carbon atoms, or linked by any linker, or a derivative thereof. The aryl group or arylene group may be, for example, an aryl group having 6 to 30 carbon atoms, 6 to 25 carbon atoms, 6 to 21 carbon atoms, 6 to 18 carbon atoms or 6 to 13 carbon atoms, unless otherwise specified.

In the present application, the term aromatic structure may mean the aryl group or arylene group.

In this specification, the term alicyclic ring structure means a cyclic hydrocarbon structure other than an aromatic ring structure, unless otherwise specified. The alicyclic ring structure may be, for example, an alicyclic ring structure having 3 to 30 carbon atoms, 3 to 25 carbon atoms, 3 to 21 carbon atoms, 3 to 18 carbon atoms or 3 to 13 carbon atoms, unless otherwise specified.

In the present application, the term single bond may mean a case where no separate atom is present at the relevant site. For example, in the structure represented by A-B-C, when B is a single bond, no separate atom exists at the site represented by B, and A and C are directly connected, so that it may mean to form a structure represented by A-C.

In the present application, the substituent, with which the alkyl group, alkenyl group, alkynyl group, alkylene group, alkenylene group, alkynylene group, alkoxy group, aryl group, arylene group, chain or aromatic structure, and the like may be optionally substituted, may be exemplified by a hydroxy group, a halogen atom, a carboxyl group, a glycidyl group, an acryloyl group, a methacryloyl group, an acryloyloxy group, a methacryloyloxy group, a thiol group, an alkyl group, an alkenyl group, an alkynyl group, an alkylene group, an alkenylene group, an alkynylene group, an alkoxy group or an aryl group, and the like, but is not limited thereto.

The present application relates to a polymer composition comprising a blend of two or more block copolymers. Specifically, the polymer composition of the present application comprises a blend of at least two block copolymers having different number average molecular weights.

In this specification, for convenience, any one block copolymer of the two block copolymers having different number average molecular weights from each other may be referred to as a first block copolymer and the other block copolymer may be referred to as a second block copolymer. The designation is merely for distinguishing the two block copolymers from each other, and one block copolymer does not prefer the other block copolymer.

The polymer composition may comprise, as a block copolymer, only the first and second block copolymers, or may comprise further block copolymers.

The term number average molecular weight is a converted value for standard polystyrene measured using GPC (gel permeation chromatograph), and the term molecular weight herein means a number average molecular weight, unless otherwise specified.

As the polymer composition comprises two kinds of block copolymers as above, the composition can exhibit excellent self-assembly properties. In particular, the polymer composition may exhibit so-called vertically oriented self-assembly properties even on a substrate, the surface of which no neutral treatment is performed, and specifically, it may be possible to form a vertically oriented cylinder structure.

In this specification, the term neutral treatment is a concept including a treatment referred to as a so-called neutral brush layer or chemical preliminary patterning, and the like in the industry, which has a meaning including a known treatment performed in order to achieve vertical orientation in the industry.

Each block copolymer may comprise a first polymer segment and a second polymer segment different from the first polymer segment. Each block copolymer may be a diblock copolymer comprising the two segments or a multi-block copolymer comprising two or more polymer segments.

The first and second polymer segments included in the block copolymer are different polymer segments from each other.

In the present application, the fact that two kinds of polymer segments are identical means any one case of cases in which in any two kinds of polymer segments the kinds of monomer units contained as the main component are identical to each other, or 50% or more, 55% or more, 60% or more, 65% or more, 70% or more, 75% or more, 80% or more, 85% or more or 90% or more of monomer unit kinds contained in two kinds of polymer segments are common and a weight ratio deviation of the common monomer units in each polymer segment is within 30%, within 25%, within 20%, within 20%, within 15%, within 10% or within 5%. Here, the monomer unit that the polymer segment comprises as a main component is a monomer unit in which 60% or more, 65% or more, 70% or more, 75% or more, 80% or more, 85% or more, or 90% or more is included and 100% or less is included in the corresponding polymer segment. If both polymer segments do not satisfy the two cases, they are polymer segments that are different from each other. Here, it may be proper that the ratio of the common monomer units is satisfied for both polymer segments. For example, if any polymer segment 1 has monomer units of A, B, C, D and F and the other polymer segment 2 has monomer units of D, F, G and H, then the common monomer units in polymer segments 1 and 2 are D and F, where in the position of polymer segment 1 the common ratio is 40% (=100×2/5) because two kinds of the total five kinds are common, but in the position of polymer segment 2 the ratio is 50% (=100× 2/5). Thus, in this case, both polymer segments may be regarded as not identical because the common ratio is not less than 50% only in polymer segment 2. On the other hand, the weight ratio deviation of the common monomers is a percentage of a numerical value in which a large weight ratio minus a small weight ratio is divided by the small weight ratio. For example, in the above case, if the weight ratio of the D monomer units in the segment 1 is about 40% based on 100% of the total weight ratio of the whole monomer units in the segment 1 and the weight ratio of the D monomer units in the segment 2 is about 30% based on 100% of the total weight ratio of the whole monomer units in the segment 2, the weight ratio deviation may be about 33% (=100×(40− 30)/30) or so. If the common monomer units are two or more kinds in two segments, in order to be the same segment, it can be considered as the common monomers when the weight ratio deviation within 30% is satisfied for all the common monomers or for the monomer unit as the main component. Each polymer segment that is recognized as the same by the above criteria may be a different type of polymer (e.g., any one segment is in the form of a block copolymer and the other segment is in the form of a random copolymer), but it may be, suitably, the same type of polymer.

Two or more block copolymers having different molecular weights from each other contained in the polymer composition of the present application may comprise the same polymer segments. For example, when the first block copolymer comprises a polymer segment A and a polymer segment B different from the first polymer block A, the second block copolymer may also comprise the polymer segment A and B. The polymer composition may further comprise a third block copolymer having also the polymer segments A and B and/or other block copolymers, if necessary.

In the polymer composition of the present application, the first and second block copolymers have different number average molecular weights from each other, and if the third block copolymer is added, the molecular weights of the first to third block copolymers may all be different.

For example, if the first block copolymer among all the block copolymers contained in the polymer composition is a block copolymer having the lowest molecular weight, the molecular weight of the first block copolymer may be in a range of about 5 to 60 Kg/mol. In another example, the molecular weight may be about 6 Kg/mol or more, 6.5 Kg/mol or more, 7 Kg/mol or more, 7.5 Kg/mol or more, 8 Kg/mol or more, 10 Kg/mol or more, 15 Kg/mol or more, or 18 Kg/mol or more, and in another example, it may be about 55 Kg/mol or less, 50 Kg/mol or less, 45 Kg/mol or less, 40 Kg/mol or less, or 35 Kg/mol or less.

In such a case, the second block copolymer has a higher molecular weight than the first block copolymer. In this case, the ratio (M2/M1) of the molecular weight (M2) of the second block copolymer to the molecular weight (M1) of the first block copolymer may be in a range of 1.2 to 10. In another example, the ratio (M2/M1) may be 1.3 or more, 1.35 or more, 1.4 or more, 1.45 or more, 1.5 or more, 1.55 or more, 1.6 or more, 1.65 or more, 1.7 or more, or 1.75 or more. Also, in another example, the ratio (M2/M1) may be 9.5 or less, 9 or less, 8.5 or less, 8 or less, 7.5 or less, 7 or less, 6.5 or less, 6 or less, 5.5 or less, 5 or less, 4.5 or less, 3.5 or less, 3 or less, or 2.5 or less. Under such a ratio, the self-assembly property and the vertical orientation property of the polymer composition can be improved.

Also, in such a case, the difference (M2−M1) between the molecular weight (M1) of the first block copolymer and the molecular weight (M2) of the second block copolymer may be about 5 Kg/mol or more, but may be 100 Kg/mol or less. In another example, the difference may be about 7 Kg/mol or more, 9 Kg/mol or more, 11 Kg/mol or more, 13 Kg/mol or more, 15 Kg/mol or more, 17 Kg/mol or more, 19 Kg/mol or more, 21 Kg/mol or more, 23 Kg/mol or more, 25 Kg/mol or more, 30 Kg/mol or more, 35 Kg/mol or more, 40 Kg/mol or more, 45 Kg/mol or more, or 50 Kg/mol or more. Furthermore, in another example, the difference may be about 95 Kg/mol or less, 90 Kg/mol or less, 85 Kg/mol or less, 80 Kg/mol or less, 75 Kg/mol or less, 70 Kg/mol or less, 65 Kg/mol or less, 60 Kg/mol or less, 55 Kg/mol or less, 50 Kg/mol or less, 45 Kg/mol or less, 40 Kg/mol or less, 35 Kg/mol or less, 30 Kg/mol or less, 25 Kg/mol or less, 20 Kg/mol or less, or 15 Kg/mol or less. Under such a ratio, the self-assembly property and the vertical orientation of the polymer composition can be improved.

When the polymer composition further comprises a third block copolymer, the third block copolymer may have an intermediate level of molecular weight of the first and second block copolymers. In this case, the ratio (M2/M3) of the molecular weight (M2) of the second block copolymer to the molecular weight (M3) of the third block copolymer or the ratio (M3/M1) of the molecular weight (M3) of the third block copolymer to the molecular weight of the first block copolymer, the difference (M2−M3) between the molecular weight (M3) of the third block copolymer and the molecular weight (M2) of the second block copolymer or the difference (M3−M1) between the molecular weight (M3) of the third block copolymer and the molecular weight (M1) of the first block copolymer and the like can be determined in the range similar to the ratio (M2/M1) of the molecular weights of the first and second block copolymers.

The ratio of the first block copolymer having the lowest molecular weight in the polymer composition may be in a range of about 10 to 90 wt % based on the total weight 100 wt % of all the block copolymers in the composition. In another example, the ratio may be about 15 wt % or more, 20 wt % or more, 25 wt % or more, 30 wt % or more, 35 wt % or more, 40 wt % or more, or 45 wt % or more. Also, in another example, the ratio may be about 85 wt % or less, 80 wt % or less, 75 wt % or less, 70 wt % or less, 65 wt % or less, 60 wt % or less, or 55 wt % or less.

In the case where the first block copolymer is a copolymer having the lowest molecular weight among the block copolymers contained in the polymer composition, the molar ratio of the first block copolymer may be in a range of about 10 to 90 mol % based on the total mole number 100 mol % of all the block copolymers in the composition. In another example, the ratio may be about 15 mol % or more, 20 mol % or more, 25 mol % or more, 30 mol % or more, 35 mol % or more, 40 mol % or more, or 45 mol % or more. Also, in another example, the ratio may be about 85 mol % or less, 80 mol % or less, 75 mol % or less, 70 mol % or less, 65 mol % or less, 60 mol % or less, or 55 mol % or less.

If the second block copolymer among all the block copolymers contained in the polymer composition is a block copolymer having the highest molecular weight, the molecular weight of the second block copolymer may be in a range of about 10 to 100 Kg/mol. In another example, the molecular weight may be about 15 Kg/mol or more, 20 Kg/mol or more, 25 Kg/mol or more, 30 Kg/mol or more, or 35 Kg/mol or more, and in another example, it may be about 95 Kg/mol or less, 90 Kg/mol or less, 85 Kg/mol or less, 80 Kg/mol or less, or 75 Kg/mol or less.

The ratio of the second block copolymer having the lowest molecular weight in the polymer composition may be in a range of about 10 to 90 wt % based on the total weight 100 wt % of all the block copolymers in the composition. In another example, the ratio may be about 15 wt % or more, 20 wt % or more, 25 wt % or more, 30 wt % or more, 35 wt % or more, 40 wt % or more, or 45 wt % or more. Also, in another example, the ratio may be about 85 wt % or less, 80 wt % or less, 75 wt % or less, 70 wt % or less, 65 wt % or less, 60 wt % or less, or 55 wt % or less.

When the second block copolymer is a copolymer having the highest molecular weight among all the block copolymers contained in the polymer composition, the molar ratio of the second block copolymer may be in a range of about 10 to 90 mol % based on the total mole number 100 mol % of all the block copolymers in the composition. In another example, the ratio may be about 15 mol % or more, or 20 mol % or more. Also, in another example, the ratio may be about 85 mol % or less, 80 mol % or less, 75 mol % or less, 70 mol % or less, 65 mol % or less, 60 mol % or less, 55 mol % or less, 50 mol % or less, 45 mol % or less, 40 mol % or less, or 35 mol % or less.

The ratio of the second block copolymer or the second and third block copolymers and the like further contained in the polymer composition is not particularly limited, but the copolymer or the copolymers may be included, for example, such that it satisfies the volume fraction to be described below.

Under such a range, the self-assembly property and the vertical orientation property of the polymer composition can be improved.

The polymer composition may comprise block copolymers such as the first and second block copolymers as a main component. That is, the total weight of the block copolymers may be 55 wt % or more, 60 wt % or more, 65 wt % or more, 70 wt % or more, 75 wt % or more, 80 wt % or more, 85 wt % or more, 90 wt % or more, or 95 wt % or more, based on the solid content of the polymer composition. In one example, the total weight may be 100 wt % or less.

As described above, the first and second block copolymers or the third block copolymer that may be contained in addition to these may each comprise the polymer segment A and the polymer segment B equally. Also, the polymer composition may further comprise a block copolymer containing either or both of the polymer segments A and B. Each of the block copolymers may be a diblock copolymer comprising only the segments A and B. The block copolymer may be a block copolymer having three blocks or more which comprises each of the polymer segments A and B by one and further comprises either or both of the polymer segments A and B, or further comprises other polymer segments rather than the polymer segments A and B.

The block copolymer comprises two or more polymer segments connected by covalent bonds, and thus phase separation occurs and a so-called self-assembled structure is formed. The present inventors have confirmed that the block copolymer can be more effectively applied in the polymer composition by satisfying any one or two or more of conditions to be described below. Accordingly, the first to third block copolymers of the present application may each satisfy at least one of the following conditions. The conditions described below are in parallel, and any one condition does not override the other conditions. The block copolymer may satisfy any one condition selected from the conditions described below, or may satisfy two or more conditions. Through the fulfillment of any one condition, the block copolymer can exhibit more effectively vertical orientation in the above-described laminate. In the present application, the term vertical orientation indicates the orientation of the block copolymer, where the orientation of the phase separation structure or the self-assembled structure formed by the block copolymer may mean an orientation perpendicular to the substrate direction, and for example, may mean a case where the interface between the domain formed by a polymer segment A and the domain formed by a polymer segment B, which are described below, of the block copolymer is perpendicular to the surface of the substrate. In the present application, the term vertical is an expression in consideration of an error, which may be a meaning including, for example, errors within ±10 degrees, ±8 degrees, ±6 degrees, ±4 degrees or ±2 degrees.

An exemplary block copolymer of the present application comprises a polymer segments A and B, wherein the block copolymer or the polymer segment A may exhibit a melting transition peak or an isotropic transition peak in a range of −80° C. to 200° C. in a DSC analysis (Condition 1).

An exemplary block copolymer of the present application comprises a polymer segments A and B, wherein the block copolymer or the polymer segment A may exhibit a peak having a half-value width in a range of 0.2 to 0.9 $nm^{-1}$ within a scattering vector (q) range of 0.5 $nm^{-1}$ to 10 $nm^{-1}$ upon an XRD analysis (Condition 2).

An exemplary block copolymer of the present application comprises a polymer segments A and B, wherein the segment A may comprise a side chain and the number (n) of chain-forming atoms in the side chain and the scattering vector (q) obtained by the XRD analysis of the polymer segment A may satisfy Equation 1 below (Condition 3).

$$3\ nm^{-1}\ to\ 5\ nm^{-1} = nq/(2\times\pi)\quad\text{[Equation 1]}$$

In Equation 1, n is a number of chain-forming atoms of the side chain, and q is the smallest scattering vector (q) in which the peak is observed in the X-ray diffraction analysis for the polymer segment containing the side chain, or the scattering vector (q) in which the peak of the largest peak area is observed.

An exemplary block copolymer of the present application comprises a polymer segments A and B, wherein the absolute value of the difference between the surface energy of the polymer segment A and the surface energy of the polymer segment B may be 10 mN/m or less (Condition 4).

An exemplary block copolymer of the present application comprises a polymer segments A and B, wherein the absolute value of the difference in density between the polymer segment A and the polymer segment B may be 0.25 $g/cm^3$ or more (Condition 5).

In the respective block copolymers, the polymer segment A may be a polymer segment comprising a side chain as described below.

Hereinafter, each of the conditions will be described in detail.

In this specification, physical properties, such as density, that can be changed by temperature are values measured at room temperature, unless otherwise specified. The term room temperature is a natural temperature without warming or cooling, which may mean a temperature of about 10° C. to 30° C., about 25° C. or about 23° C.

A. Condition 1

The block copolymer of the present application or any one polymer segment of the block copolymer may exhibit a melting transition peak or isotropic transition peak in a range of −80° C. to 200° C. in a DSC (differential scanning calorimetry) analysis. The block copolymer or any one polymer segment of the block copolymer may also exhibit only any one peak of the melting transition peak or the isotropic transition peak, or may exhibit both of the two peaks. Such a block copolymer may be a copolymer exhibiting a crystal phase and/or a liquid crystal phase suitable for self-assembly as a whole or comprising a polymer segment exhibiting such a crystal phase and/or a liquid crystal phase. The polymer segment satisfying Condition 1 above may be a polymer segment A.

Unless otherwise specifically stated, the unit of temperature herein is ° C.

The block copolymer exhibiting the above-described DSC behavior or any one polymer segment of the block copolymer may further satisfy the following conditions.

For example, when the isotropic transition peak and the melting transition peak appear simultaneously, the difference (Ti−Tm) between the temperature (Ti) at which the isotropic transition peak appears and the temperature (Tm) at which the melting transition peak appears may be in a range of 5° C. to 70° C. In another example, the difference (Ti−Tm) may be 10° C. or more, 15° C. or more, 20° C. or more, 25° C. or more, 30° C. or more, 35° C. or more, 40° C. or more, 45° C. or more, 50° C. or more, 55° C. or more, or 60° C. or more. The block copolymer having a difference (Ti−Tm) between the temperature (Ti) of the isotropic transition peak and the temperature (Tm) of the melting transition peak in the above range or the block copolymer comprising such a polymer segment can maintain excellent phase separation or self-assembly characteristics.

In another example, when the isotropic transition peak and the melting transition peak appear simultaneously, the ratio (M/I) of the area (I) of the isotropic transition peak and the area (M) of the melting transition peak may be in a range of 0.1 to 500. In the DSC analysis, the block copolymer having a ratio (M/I) of the area (I) of the isotropic transition peak and the area (M) of the melting transition peak in the above range or the block copolymer comprising such a polymer segment can maintain excellent phase separation or self-assembly characteristics. In another example, the ratio (M/I) may be 0.5 or more, 1 or more, 1.5 or more, 2 or more, 2.5 or more, or 3 or more. In another example, the ratio (M/I) may be 450 or less, 400 or less, 350 or less, 300 or less, 250 or less, 200 or less, 150 or less, 100 or less, 90 or less, or 85 or less.

A method of performing the DSC analysis is known, and in the present application, the above analysis can be performed by such a known method.

The temperature (Tm) range at which the melting transition peak appears may be a range of −10° C. to 55° C. In another example, the temperature (Tm) may be 50° C. or less, 45° C. or less, 40° C. or less, 35° C. or less, 30° C. or less, 25° C. or less, 20° C. or less, 15° C. or less, 10° C. or less, 5° C. or less, or 0° C. or less.

The block copolymer may comprise a polymer segment having a side chain, as described below. In this case, the block copolymer may satisfy Equation 2 below.

$$10°\ C. \leq Tm - 12.25 \times n + 149.5 \leq 10°\ C.\quad\text{[Equation 2]}$$

In Equation 2, Tm is a temperature at which a melting transition peak of the block copolymer or the polymer segment having the side chain appears, and n is a number of chain-forming atoms of the side chain.

The block copolymer satisfying Equation above may have excellent phase separation or self-assembly properties.

In another example, Tm−12.25×n+149.5 in Equation 2 may be −8° C. to 8° C., −6° C. to 6° C., or about −5° C. to 5° C. or so.

B. Condition 2

The block copolymer of the present application may comprise a polymer segment showing at least one peak in a predetermined range of the scattering vector (q) upon the XRD analysis (X-ray diffraction analysis). The polymer segment satisfying Condition 2 may be the polymer segment A.

For example, any one polymer segment of the block copolymer may exhibit at least one peak in a scattering vector (q) range of 0.5 nm$^{-1}$ to 10 nm$^{-1}$ in the X-ray diffraction analysis. In another example, the scattering vector (q) at which the peak appears may be 0.7 nm$^{-1}$ or more, 0.9 nm$^{-1}$ or more, 1.1 nm$^{-1}$ or more, 1.3 nm$^{-1}$ or more, or 1.5 nm$^{-1}$ or more. In another example, the scattering vector (q) at which the peak appears may be 9 nm$^{-1}$ or less, 8 nm$^{-1}$ or less, 7 nm$^{-1}$ or less, 6 nm$^{-1}$ or less, 5 nm$^{-1}$ or less, 4 nm$^{-1}$ or less, 3.5 nm$^{-1}$ or less, or 3 nm$^{-1}$ or less. The half-value width (full width at half maximum, FWHM) of the peak identified in the above scattering vector (q) range may be in the range of 0.2 to 0.9 nm$^{-1}$. In another example, the half-value width may be 0.25 nm$^{-1}$ or more, 0.3 nm$^{-1}$ or more, or 0.4 nm$^{-1}$ or more. In another example, the half-value width may be 0.85 nm$^{-1}$ or less, 0.8 nm$^{-1}$ or less, or 0.75 nm$^{-1}$ or less.

In Condition 2, the term half-value width may mean a width of the peak (the difference in the scattering vector (q)) at a position showing the ½ intensity of the maximum peak intensity.

The scattering vector (q) and the half-value width in the XRD analysis are values obtained by a numerical analytical method in which the results obtained by the XRD analysis to be described below are applied by a least-square method. In the method, the profile of the XRD patterns is subjected to Gaussian fitting in a state where a portion showing the smallest intensity in the XRD diffraction patterns is taken as a baseline and the intensity in the above is set to zero, and then the scattering vector and the half-value width can be obtained from the fitted results. The R square at the time of Gaussian fitting is at least 0.9 or more, 0.92 or more, 0.94 or more, or 0.96 or more. A method capable of obtaining the information as above from the XRD analysis is known, and for example, a numerical analysis program such as origin can be applied.

The polymer segment showing the peak of the half-value width in the above scattering vector (q) range may comprise a crystalline site suitable for self-assembly. The block copolymer comprising the polymer segment identified in the above-described scattering vector (q) range may exhibit excellent self-assembly properties.

The XRD analysis can be performed by transmitting X-rays to a sample and then measuring the scattering intensity according to the scattering vector. The XRD analysis can be performed using a polymer prepared by polymerizing only a monomer constituting any one polymer segment of the block copolymer, for example, the polymer segment A. The XRD analysis can be performed on such a polymer without any special pretreatment, and for example, can be performed by drying the polymer under appropriate conditions and then passing it through X-rays. As the X-ray, an X-ray having a vertical size of 0.023 mm and a horizontal size of 0.3 mm can be applied. The scattering vector and the half-value width can be obtained by obtaining as an image 2D diffraction patterns that are scattered in the sample and exited using a measuring instrument (for example, 2D marCCD), and fitting the obtained diffraction pattern with the above-described manner.

C. Condition 3

The block copolymer of the present application may comprise, as the polymer segment A, a polymer segment having a side chain to be described below, wherein the number (n) of chain-forming atoms of the side chain can satisfy Equation 1 below with the scattering vector (q) obtained by the X-ray diffraction analysis performed in the same manner as in Condition 2 above.

$$3 \text{ nm}^{-1} \text{ to } 5 \text{ nm}^{-1} = nq/(2\times\pi) \qquad \text{[Equation 1]}$$

In Equation 1, n is a number of the chain-forming atoms, and q is the smallest scattering vector (q) in which the peak is observed in the X-ray diffraction analysis for the polymer segment containing the side chain, or the scattering vector (q) in which the peak of the largest peak area is observed. Also, in Equation 1, π means the circular constant.

The scattering vector or the like introduced into Equation 1 is a value obtained by the same manner mentioned in the above-described X-ray diffraction analysis method.

The scattering vector (q) introduced in Equation 1 may be, for example, a scattering introduced into Equation 1 may be 0.7 nm$^{-1}$ or more, 0.9 nm$^{-1}$ or more, 1.1 nm$^{-1}$ or more, 1.3 nm$^{-1}$ or more, or 1.5 nm$^{-1}$ or more. In another example, the scattering vector (q) introduced into Equation 1 above may be 9 nm$^{-1}$ or less, 8 nm$^{-1}$ or less, 7 nm$^{-1}$ or less, 6 nm$^{-1}$ or less, 5 nm$^{-1}$ or less, 4 nm$^{-1}$ or less, 3.5 nm$^{-1}$ or less, or 3 nm$^{-1}$ or less.

When a polymer composed of only the polymer segment comprising the side chain of the block copolymer has formed a film, Equation 1 shows a relationship of the distance (D) between the polymer main chains containing the side chains and the number of chain-forming atoms in the side chain, and when the number of chain-forming atoms of the side chain in the polymer having the side chain satisfies Equation 1 above, the crystallinity represented by the side chain is increased, whereby the phase separation property or the vertical orientation can be significantly improved. In another example, the nq/(2×π) according to Equation 1 above may also be 4.5 nm$^{-1}$ or less. Here, the distance (D, unit: nm) between the polymer main chains in which the side chains are contained can be calculated by the equation D=2×π/q, where D is the distance (D, unit: nm), and it and q are as defined in Equation 1.

D. Condition 4

The absolute value of the difference between the surface energy of the polymer segment A and the surface energy of the polymer segment B in the block copolymer of the present application may be 10 mN/m or less, 9 mN/m or less, 8 mN/m or less, 7.5 mN/m or less, or 7 mN/m or less. The absolute value of the difference in surface energy may be 1.5 mN/m, 2 mN/m or 2.5 mN/m or more. The structure in which the polymer segments A and B having the absolute value of the difference in surface energy in this range are connected by covalent bonds can induce effective microphase separation. Here, the polymer segment A may be, for example, a polymer segment having a side chain as described below.

The surface energy can be measured using a drop shape analyzer (DSA100 product from KRUSS). Specifically, the surface energy can be measured for a film in which a coating liquid obtained by diluting a target sample (block copolymer or homopolymer), which is measured, in fluorobenzene to a solid concentration of about 2 wt %, is coated on a substrate to a thickness of about 50 nm and a coating area of 4 cm$^2$ (width: 2 cm, height: 2 cm), and dried at room temperature for about 1 hour, and then subjected to thermal annealing at 160° C. for about 1 hour. The process of dropping the deionized water whose surface tension is known on the film subjected to the thermal annealing and obtaining the contact angle thereof is repeated five times to obtain an average value of the obtained five contact angle values, and identically, the process of dropping the diiodomethane whose surface tension is known thereon and obtaining the contact angle thereof is repeated five times to obtain an average value of the obtained five contact angle values. Then, the surface energy can be obtained by substituting the value (Strom value) regarding the solvent surface tension by the Owens-Wendt-Rabel-Kaelble method using the obtained average values of the contact angles for the deionized water and diiodomethane. The numerical value of the surface energy for each polymer segment of the block copolymer can be obtained for a homopolymer made of only the monomer forming the polymer segment by the above-described method.

When the block copolymer comprises the above-described side chain, the polymer segment comprising the side chain may have a higher surface energy than the other polymer segment. For example, if the polymer segment A of the block copolymer comprises the side chain, the polymer segment A may have a higher surface energy than the polymer segment B. In this case, the surface energy of the polymer segment A may be in a range of about 20 mN/m to 40 mN/m. The surface energy of the polymer segment A may be 22 mN/m or more, 24 mN/m or more, 26 mN/m or more, or 28 mN/m or more. The surface energy of the polymer segment A may be 38 mN/m or less, 36 mN/m or less, 34 mN/m or less, or 32 mN/m or less. The block copolymer comprising such a polymer segment A and exhibiting a difference in surface energy from the polymer segment B as above can exhibit excellent self-assembly properties.

E. Condition 5

The absolute value of the difference in density between the polymer segment A and the polymer segment B in the block copolymer may be 0.25 g/cm$^3$ or more, 0.3 g/cm$^3$ or more, 0.35 g/cm$^3$ or more, 0.4 g/cm$^3$ or more, or 0.45 g/cm$^3$ or more. The absolute value of the difference in density may be 0.9 g/cm$^3$ or less, 0.8 g/cm$^3$ or less, 0.7 g/cm$^3$ or less, 0.65 g/cm$^3$ or less, or 0.6 g/cm$^3$ or less. The structure in which the polymer segment A and the polymer segment B having the absolute value of the density difference in this range are linked by covalent bonds can induce effective microphase separation by phase separation due to proper non-compatibility.

The density of each polymer segment in the block copolymer can be measured using a known buoyancy method, and for example, the density can be measured by analyzing the mass of the block copolymer in a solvent, such as ethanol, which is known in mass and density in air.

When the above-described side chain is included, the polymer segment comprising the side chain may have a lower density than the other polymer segment. For example, if the polymer segment A of the block copolymer comprises the side chain, the polymer segment A may have a lower density than the polymer segment B. In this case, the density of the polymer segment A may be in a range of about 0.9 g/cm$^3$ to 1.5 g/cm$^3$ or so. The density of the polymer segment A may be 0.95 g/cm$^3$ or more. The density of the polymer segment A may be 1.4 g/cm$^3$ or less, 1.3 g/cm$^3$ or less, 1.2 g/cm$^3$ or less, 1.1 g/cm$^3$ or less, or 1.05 g/cm$^3$ or less. The block copolymer comprising such a polymer segment A and exhibiting a density difference with the polymer segment B as above can exhibit excellent self-assembly properties.

As described above, the block copolymer may satisfy any one of the above conditions, or may satisfy two or more selected from them.

In one example, the block copolymer may comprise a polymer segment A satisfying any one or two or more of Conditions 1 to 3 among the above conditions and a polymer segment B having a difference in surface energy according to Condition 4 above.

Although not limited by theory, the polymer segment A satisfying any one of Conditions 1 to 3 can exhibit crystallinity or liquid crystallinity, and accordingly, it can be packed with regularity upon forming the self-assembled structure. In this state, when the polymer segment A and the polymer segment B satisfy the difference in surface energy according to Condition 4, the domains formed by the respective polymer segments A and B are substantially neutralized, whereby the film can be oriented vertically in the structure of the above-mentioned laminate even if there is no neutral treatment region.

The above-mentioned conditions can be achieved, for example, by controlling the structure of the block copolymer. For example, the polymer segment A of the block copolymer satisfying one or more of the above-mentioned conditions may comprise the side chain to be described below. The polymer segment A may comprise a ring structure, where the side chain may be substituted on the ring structure. The side chain may be directly substituted on the ring structure or may be substituted via a suitable linker. The ring structure may be an aromatic structure or an alicyclic ring structure as described above. No halogen atom may be present in such a ring structure. The polymer segment B contained in the block copolymer together with the polymer segment A may comprise 3 or more halogen atoms. At this time, the polymer segment B may comprise a ring structure, where the halogen atoms may be substituted on the ring structure. The ring structure may be an alicyclic ring structure or an aromatic structure as described above.

Here, the aromatic structure or the alicyclic ring structure may be a structure contained in the main chain of the polymer segment, or may be a structure linked to the polymer segment main chain in a side chain form.

In one example, the block copolymer satisfying one or more of the above conditions may comprise a polymer segment A comprising a side chain and a polymer segment B different therefrom. Here, the side chain may be a side chain having 8 or more chain-forming atoms, as described below. The polymer segment A may be a polymer segment satisfying any one of the above-described conditions 1 to 3, satisfying two or more of the foregoing, or satisfying all of the above conditions.

Here, the term side chain means a chain connected to the main chain of the polymer, and the term chain-forming atom is an atom forming the side chain, which means an atom forming the straight chain structure of the chain. The side chain may be linear or branched, but the number of chain-forming atoms is calculated by only the number of atoms forming the longest straight chain, where other atoms bonded to the chain-forming atoms (for example, when the chain-forming atom is a carbon atom, hydrogen atoms bonding to the carbon atom, etc.) are not included in the calculation. For example, in the case of a side chain, the number of chain-forming atoms can be calculated as the number of chain-forming atoms forming the longest chain moiety. For example, when the side chain is an n-pentyl group, all of the chain-forming atoms are carbon atoms and the number thereof is 5, and even when the side chain is a 2-methylpentyl group, all of the chain-forming atoms are carbon atoms and the number thereof is 5. The chain-forming atom may be exemplified by carbon, oxygen, sulfur or nitrogen, and the like, and the appropriate chain-forming atom may be carbon, oxygen or nitrogen, or may be carbon or oxygen. The number of chain-forming atoms may be 8 or more, 9 or more, 10 or more, 11 or more, or 12 or more. The number of the chain-forming atoms may be 30 or less, 25 or less, 20 or less, or 16 or less.

For the control of the above-described conditions, the polymer segment A of the block copolymer may have a chain with 8 or more chain-forming atoms connected to the side chain. In this specification, the term chain and side chain may refer to the object identical to each other.

The side chain may be a chain comprising 8 or more, 9 or more, 10 or more, 11 or more, or 12 or more chain-forming atoms, as mentioned above. Also, the number of the chain-forming atoms may be 30 or less, 25 or less, 20 or less, or 16 or less. The chain-forming atom may be a carbon, oxygen, nitrogen or sulfur atom and may suitably be carbon or oxygen.

As the side chain, a hydrocarbon chain such as an alkyl group, an alkenyl group or an alkynyl group can be exemplified. At least one of the carbon atoms of the hydrocarbon chain may be replaced by a sulfur atom, an oxygen atom or a nitrogen atom.

When the side chain is connected to the ring structure, the chain may be directly connected to the ring structure or may be connected via a linker. The linker may be exemplified by an oxygen atom, a sulfur atom, —NR$_1$—, —S(=O)$_2$—, a carbonyl group, an alkylene group, an alkenylene group, an alkynylene group, —C(=O)—X$_1$— or —X$_1$—C(=O)—. Here, R$_1$ may be hydrogen, an alkyl group, an alkenyl group, an alkynyl group, an alkoxy group or an aryl group, and X$_1$ may be a single bond, an oxygen atom, a sulfur atom, —NR$_2$—, —S(=O)$_2$—, an alkylene group, an alkenylene group or an alkynylene group, where R$_2$ may be hydrogen, an alkyl group, an alkenyl group, an alkynyl group, an alkoxy group or an aryl group. The suitable linker may be exemplified by an oxygen atom. The side chain may be connected to a ring structure such as an aromatic structure, for example, via an oxygen atom or a nitrogen atom.

When the ring structure such as the aromatic structure described above is connected to the main chain of the polymer segment in a side chain form, the aromatic structure may also be directly connected to the main chain or may be connected via a linker. In this case, the linker can be exemplified by an oxygen atom, a sulfur atom, —S(=O)$_2$—, a carbonyl group, an alkylene group, an alkenylene group, an alkynylene group, —C(=O)—X$_1$— or —X$_1$—C(=O)—, where X$_1$ may be a single bond, an oxygen atom, a sulfur atom, —S(=O)$_2$—, an alkylene group, an alkenylene group or an alkynylene group. The suitable linker connecting the aromatic structure to the main chain can be exemplified by —C(=O)—O— or —O—C(=O)—, but is not limited thereto.

In another example, the ring structure such as the aromatic structure contained in the polymer segment B of the block copolymer may comprise 1 or more, 2 or more, 3 or more, 4 or more, or 5 or more halogen atoms. The number of halogen atoms may be, for example, 30 or less, 25 or less, 20 or less, 15 or less, or 10 or less. The halogen atom may be exemplified by fluorine or chlorine, and the like, and the use of a fluorine atom may be advantageous. As described above, the polymer segment having a ring structure such as an aromatic structure containing a halogen atom can efficiently realize a phase separation structure through proper interaction with other polymer segments.

Here, the polymer segment A may be, for example, a polymer segment comprising a unit represented by Formula 1 below. The polymer segment may be a polymer segment containing a unit of Formula 1 below as a main component. In this specification, the fact that any polymer segment comprises a certain unit as a main component may mean a case where the polymer segment comprises the unit 60% or more, 70% or more, 80% or more, 90% or more, or 95% or more by weight, or a case where it comprises the unit 60 mol % or more, 70 mol % or more, 80 mol % or more, 90 mol % or more, or 95 mol % or more.

[Formula 1]

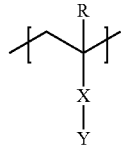

In Formula 1, R is hydrogen or an alkyl group having 1 to 4 carbon atoms, X is a single bond, an oxygen atom, a sulfur atom, —S(=O)$_2$—, a carbonyl group, an alkylene group, an alkenylene group, an alkynylene group, —C(=O)—X$_1$— or —X$_1$—C(=O)—, where X$_1$ is an oxygen atom, a sulfur atom, —S(=O)$_2$—, an alkylene group, an alkenylene group or an alkynylene group, and Y is a monovalent substituent comprising a ring structure to which the side chain having 8 or more chain-forming atoms is linked.

When the side chain is an alkyl group, the alkyl group may contain 8 or more, 9 or more, 10 or more, 11 or more, or 12 or more carbon atoms, where the number of carbon atoms of this alkyl group may be 30 or less, 25 or less, 20 or less, or 16 or less. Also, when the side chain is an alkenyl group or alkynyl group, it may contain 8 or more, 9 or more, 10 or more, 11 or more, or 12 or more carbon atoms, where the number of carbon atoms of this alkenyl group or alkynyl group may be 30 or less, 25 or less, 20 or less, or 16 or less.

In another example, X of Formula 1 may be —C(=O)O— or —OC(=O)—.

In Formula 1, Y is a substituent comprising the above-described side chain, which may be, for example, a substituent containing an aromatic structure having 6 to 18 carbon atoms or 6 to 12 carbon atoms. Here, the chain may be, for example, a linear alkyl group containing 8 or more, 9 or more, 10 or more, 11 or more, or 12 or more carbon atoms. This alkyl group may contain 30 or less, 25 or less, 20 or less, or 16 or less carbon atoms. Such a chain may be linked to the aromatic structure directly or via the above-mentioned linker.

In another example, the unit of Formula 1 above in the polymer segment A may be a unit of Formula 2 below.

[Formula 2]

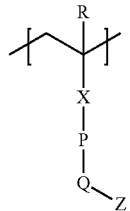

In Formula 2, R is hydrogen or an alkyl group having 1 to 4 carbon atoms, X is —C(=O)—O—, P is an arylene group having 6 to 12 carbon atoms, Q is an oxygen atom, and Z is the side chain having 8 or more chain-forming atoms.

In another example, P in Formula 2 may be phenylene, and in another example, Z may be a linear alkyl group having 9 to 20 carbon atoms, 9 to 18 carbon atoms, 9 to 16 carbon atoms, 10 to 16 carbon atoms, 11 to 16 carbon atoms or 12 to 16 carbon atoms. Here, when P is phenylene, Q may be connected to the para position of the phenylene. Here, the alkyl group, arylene group, phenylene group and side chain may be optionally substituted with one or more substituents.

The polymer segment B of the block copolymer may be, for example, a polymer segment containing a unit represented by Formula 3 below. The polymer segment may comprise a unit of Formula 3 below as a main component.

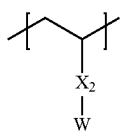

[Formula 3]

In Formula 3, $X_2$ is a single bond, an oxygen atom, a sulfur atom, —S(=O)$_2$—, an alkylene group, an alkenylene group, an alkynylene group, —C(=O)—$X_1$— or —$X_1$—C(=O)—, where $X_1$ is a single bond, an oxygen atom, a sulfur atom, —S(=O)$_2$—, an alkylene group, an alkenylene group or an alkynylene group, and W is an aryl group containing at least one halogen atom.

In another example, $X_2$ of Formula 3 may be a single bond or an alkylene group.

In Formula 3, the aryl group of W may be an aryl group having 6 to 12 carbon atoms or a phenyl group, and this aryl group or phenyl group may contain 1 or more, 2 or more, 3 or more, 4 or more, or 5 or more halogen atoms. Here, the number of halogen atoms may be, for example, 30 or less, 25 or less, 20 or less, 15 or less, or 10 or less. As the halogen atom, a fluorine atom may be exemplified.

In another example, the unit of Formula 3 may be represented by Formula 4 below.

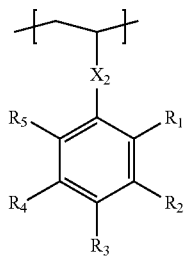

[Formula 4]

In Formula 4, $X_2$ is a single bond, an oxygen atom, a sulfur atom, —S(=O)$_2$—, an alkylene group, an alkenylene group, an alkynylene group, —C(=O)—$X_1$— or —$X_1$—C(=O)—, where $X_1$ is a single bond, an oxygen atom, a sulfur atom, —S(=O)$_2$—, an alkylene group, an alkenylene group or an alkynylene group, $R_1$ to $R_5$ are each independently hydrogen, an alkyl group, a haloalkyl group or a halogen atom, and the number of halogen atoms contained in $R_1$ to $R_5$ is 1 or more.

In Formula 4, $R_1$ to $R_5$ may be each independently a hydrogen atom, an alkyl group having 1 to 4 carbon atoms or a haloalkyl group having 1 to 4 carbon atoms or halogen, where halogen may be chlorine or fluorine.

In Formula 4, 2 or more, 3 or more, 4 or more, 5 of $R_1$ to $R_5$ may contain halogen. The upper limit of the halogen number is not particularly limited and may be, for example, 12 or less, 8 or less, or 7 or less.

As described above, the block copolymer may be a diblock copolymer comprising any two of the above units, or may be a block copolymer comprising any one or both of the two polymer segments together with other polymer segments.

The method of producing such a block copolymer is not particularly limited. The block copolymer may be polymerized by, for example, an LRP (Living Radical Polymerization) method, and an example thereof includes anionic polymerization in which the block copolymer is synthesized in the presence of an inorganic acid salt such as an alkali metal or an alkali earth metal by using an organic rare earth metal complex as a polymerization initiator or by using an organic alkali metal compound as a polymerization initiator, an anionic polymerization method in which the block copolymer is synthesized in the presence of an organic aluminum compound by using an organic alkali metal compound as a polymerization initiator, an atom transfer radical polymerization method (ATRP) using an atom transfer radical polymerization agent as a polymerization inhibitor, an ARGET (Activators Regenerated by Electron Transfer) atom transfer radical polymerization method (ATRP), which uses an atom transfer radical polymerization agent as a polymerization initiator, but performs polymerization under an organic or inorganic reducing agent that generates electrons, an ICAR (Initiators for Continuous Activator Regeneration) atom transfer radical polymerization method (ATRP), a polymerization method by reversible addition-fragmentation chain transfer (RAFT) using an inorganic reducing agent and a reversible addition-fragmentation chain transfer agent or a method of using an organotellurium compound as an initiator, and the like, and a suitable method may be selected among these methods and applied.

In the case where the polymer composition comprises the first and second block copolymers each containing the polymer segments A and B as above, the sum of the volume fractions of all the polymer segments A in the polymer composition may be in the range of 0.5 to 0.7, and the sum of the volume fractions of all the polymer segments A and all the polymer segments B in the polymer composition may be 1. Here, the term all the polymer segments A is one including not only the polymer segments A contained in the first and second block copolymers but also, when other block copolymers containing the polymer segment A such as the third block copolymer are added, the segment A in the added copolymer, which is the same for polymer segment B as well. The polymer composition comprising two block copolymers containing each segment at such a volume fraction can exhibit excellent self-assembly properties and can effectively form a cylinder structure in particular. The volume fraction of each polymer segment of the block copolymer can be determined based on the density and the molecular weight measured by GPC (gel permeation chromatography), of each polymer segment.

The present application also relates to a method for producing a polymer film using the polymer composition. The polymer film may be used for various applications, and for example, may be used for various electric or electronic elements, a process of forming the pattern, a recording medium such as a magnetic storage medium and a flash memory, or a biosensor, and the like.

In one example, the first and/or second block copolymers in the polymer film may implement a periodic structure including a sphere, a cylinder, a gyroid, a lamella, or the like through self-assembly. Such a structure may be vertically oriented.

In one example, the polymer film may form a vertically oriented cylinder structure. Accordingly, the production method may comprise a step of forming a polymer film using the above-mentioned polymer composition and inducing a cylinder structure of the block copolymer in the polymer film. The cylinder structure may be a vertically oriented structure.

The above step may comprise a process of applying the block copolymer or a coating liquid comprising the same to form a layer, and annealing it. Here, the annealing process may be a thermal annealing process, or may be a solvent annealing process.

The thermal annealing may be performed based on, for example, the phase transition temperature or the glass transition temperature of the block copolymer, and may be performed at, for example, a temperature above the glass transition temperature or the phase transition temperature. The time for which this thermal annealing is performed is not particularly limited, and the treatment can be performed within a range of, for example, about 1 minute to 72 hours, but the time can be changed as needed. In the thermal annealing process, the heat treatment temperature may be, for example, about 100° C. to 250° C., but this may be changed in consideration of the block copolymer to be used.

In addition, the solvent annealing process may also be performed in an appropriate non-polar solvent and/or polar solvent at room temperature for about 1 minute to 72 hours.

The present application also relates to a method for producing a patterned substrate. In relation to a laminate comprising a substrate and the polymer film formed on the substrate, wherein the polymer film is a polymer film forming the self-assembled structure by using the above-described polymer composition, the method may comprise a step of selectively removing any one of the polymer segments A and B in such a polymer film.

The method may be a method of forming a pattern on the substrate. For example, the method may comprise forming the polymer film on a substrate, selectively removing one or more polymer segments of the block copolymer present in the film, and then etching the substrate. In this way, it is possible to form, for example, a nanoscale fine pattern. In addition, various types of patterns such as nano-rods or nano-holes can be formed through the above-described method depending on the shape of the block copolymer in the polymer film. If necessary, a copolymer different from the block copolymer or a homopolymer, and the like may be mixed for pattern formation.

Here, as the substrate, for example, various types of substrates requiring formation of a pattern on the surface may all be used. This type of substrate may include, for example, a silicon substrate, a silicon germanium substrate, a GaAs substrate, a silicon oxide substrate, and the like. As the substrate, for example, a substrate applied to formation of finFETs (fin field effect transistors) or other electronic devices such as diodes, transistors or capacitors may be used. In addition, other materials such as ceramics may be used as the substrate depending on the application, and the types of substrates that can be applied in the present application are not limited thereto.

The method of selectively removing any one polymer segment in the above method is not particularly limited, and for example, a method of removing a relatively soft polymer segment by irradiating the polymer film with an appropriate electromagnetic wave, for example, ultraviolet or the like, can be used. In this case, the ultraviolet irradiation condition is determined according to the type of the polymer segment of the block copolymer, and the method can be performed, for example, by being irradiated with ultraviolet having a wavelength of about 254 nm for 1 minute to 60 minutes.

Following the ultraviolet irradiation, a step of treating the polymer film with an acid or the like to further remove the segment decomposed by ultraviolet may also be performed.

The step of etching the substrate using the polymer film in which the polymer segments are selectively removed as a mask is not particularly limited, which may be performed, for example, through a reactive ion etching step using $CF_4/Ar$ ions or the like and following this process, a step of removing the polymer film from the substrate by an oxygen plasma treatment or the like may also be performed.

Advantageous Effects

The present application may provide a polymer composition having excellent self-assembly properties and capable of forming a vertical orientation structure even on a surface that no neutral treatment is performed, where the vertically oriented self-assembled structure can be effectively formed in a short time, and a use thereof.

BRIEF DESCRIPTION OF DRAWINGS

The FIGURE is an SEM photograph of the polymer film of Example 1.

MODE FOR INVENTION

Hereinafter, the present application will be described in detail by way of examples according to the present application and comparative examples, but the scope of the present application is not limited by the following examples.

1. NMR Measurement

NMR analyses were performed at room temperature using an NMR spectrometer including a Varian Unity Inova (500 MHz) spectrometer with a triple resonance 5 mm probe. The analytes were diluted in a solvent for NMR measurement ($CDCl_3$) to a concentration of about 10 mg/ml, and chemical shifts were expressed in ppm.

<Application Abbreviation> br=broad signal, s=singlet, d=doublet, dd=double doublet, t=triplet, dt=double triplet, q=quartet, p=quintet, m=multiplet.

2. GPC (Gel Permeation Chromatograph)

The number average molecular weight (Mn) and the molecular weight distribution were measured using GPC (gel permeation chromatography). Into a 5 mL vial, an analyte such as block copolymers of Examples or Comparative Examples or a giant initiator is put and diluted in THF (tetrahydrofuran) to be a concentration of about 1 mg/mL or so. Then, a standard sample for calibration and a sample to be analyzed were filtered through a syringe filter (pore size: 0.45 μm) and then measured. As the analytical program, ChemStation from Agilent Technologies was used, and the elution time of the sample was compared with the calibration curve to obtain the weight average molecular weight (Mw) and the number average molecular weight (Mn), respectively, and the molecular weight distribution (PDI) was calculated by the ratio (Mw/Mn) thereof. The measurement conditions of GPC are as follows.

<GPC Measurement Condition>
Instrument: 1200 series from Agilent Technologies
Column: using two PLgel mixed B from Polymer Laboratories
Solvent: THF
Column temperature: 35° C.
Sample concentration: 1 mg/mL, 200 L injection
Standard samples: polystyrene (Mp: 3900000, 723000, 316500, 52200, 31400, 7200, 3940, 485)

3. XRD Analysis Method

The XRD analysis was performed by transmitting X rays to a sample at a Pohang accelerator 4C beamline to measure the scattering intensity according to the scattering vector (q). As the sample, a block copolymer in a powder state dried by purifying a synthesized block copolymer without special pretreatment and then maintaining it in a vacuum oven for one day or so, was placed in a cell for XRD measurement and used. Upon the XRD pattern analysis, an X-ray with a vertical size of 0.023 mm and a horizontal size of 0.3 mm was used and a 2D marCCD was used as a detector. A 2D diffraction pattern scattered and exited was obtained as an image. The obtained diffraction pattern was analyzed by a numerical analytical method to which a least-square method was applied to obtain information such as a scattering vector and a half-height width. Upon the analysis, an origin program was applied, and the profile of the XRD patterns was subjected to Gaussian fitting in a state where a portion showing the smallest intensity in the XRD diffraction patterns was taken as a baseline and the intensity in the above was set to zero, and then the scattering vector and the half-height width were obtained from the fitted results. Upon Gaussian fitting, the R square was at least set to be 0.96 or more.

4. Measurement of Surface Energy

The surface energy was measured using a drop shape analyzer (DSA100 product from KRUSS). A coating liquid was prepared by diluting the substance (polymer), which is measured, in fluorobenzene to a solid concentration of about 2 wt %, and the prepared coating liquid was spin-coated on a silicon wafer to a thickness of about 50 nm and a coating area of 4 cm$^2$ (width: 2 cm, height: 2 cm). The coating layer was dried at room temperature for about 1 hour and then subjected to thermal annealing at about 160° C. for about 1 hour. The process of dropping the deionized water whose surface tension was known on the film subjected to thermal annealing and obtaining the contact angle thereof was repeated five times to obtain an average value of the obtained five contact angle values. In the same manner, the process of dropping the diiodomethane whose surface tension was known thereon and obtaining the contact angle thereof was repeated five times to obtain an average value of the obtained five contact angle values. The surface energy was obtained by substituting the value (Strom value) regarding the solvent surface tension by the Owens-Wendt-Rabel-Kaelble method using the obtained average values of the contact angles for the deionized water and diiodomethane. The numerical value of the surface energy for each polymer segment of the block copolymer was obtained for a homopolymer made of only the monomer forming the polymer segment by the above-described method.

5. Measurement of Volume Fraction

The volume fraction of each polymer segment of the block copolymer was calculated based on the density of each polymer segment at room temperature and the molecular weight measured by GPC. Here, the density was measured using a buoyancy method, and specifically, it was calculated by placing a sample to be analyzed in a solvent (ethanol) to know the mass and density in air, and measuring the mass.

Preparation Example 1. Synthesis of Monomer (A)

A compound (DPM-C12) of Formula A below was synthesized in the following manner. Hydroquinone (10.0 g, 94.2 mmol) and 1-bromododecane (23.5 g, 94.2 mmol) were placed in a 250 mL flask, dissolved in 100 mL of acetonitrile, and then an excess amount of potassium carbonate was added thereto and reacted at 75° C. for about 48 hours under a nitrogen condition. After the reaction, the remaining potassium carbonate was filtered off and the acetonitrile used in the reaction was also removed. A mixed solvent of DCM (dichloromethane) and water was added thereto to work up the mixture, and the separated organic layers were collected and passed through MgSO$_4$ to be dehydrated. Subsequently, the target product (4-dodecyloxyphenol) (9.8 g, 35.2 mmol) in a white solid phase was obtained in a yield of about 37% using DCM (dichloromethane) in column chromatography.

<NMR Analysis Result>
$^1$H-NMR (CDCl$_3$): d6.77 (dd, 4H); δd4.45 (s, 1H); d3.89 (t, 2H); d1.75 (p, 2H); d1.43 (p, 2H); d1.33-1.26 (m, 16H); d0.88 (t, 3H).

The synthesized 4-docecyloxyphenol (9.8 g, 35.2 mmol), methacrylic acid (6.0 g, 69.7 mmol), DCC (dicyclohexylcarbodiimide) (10.8 g, 52.3 mmol) and DMAP (p-dimethylaminopyridine) (1.7 g, 13.9 mmol) were placed in the flask and 120 mL of methylene chloride was added thereto, and then reacted at room temperature for 24 hours under nitrogen. After completion of the reaction, the salt (urea salt) generated during the reaction was filtered off and the remaining methylene chloride was also removed. Impurities were removed using hexane and DCM (dichloromethane) as the mobile phase in column chromatography and the product obtained again was recrystallized in a mixed solvent of methanol and water (1:1 mix) to obtain the target product (7.7 g, 22.2 mmol) in a white solid phase in a yield of 63%.

<NMR Analysis Result>
$^1$H-NMR (CDCl$_3$): d7.02 (dd, 2H); δd6.89 (dd, 2H); d6.32 (dt, 1H); d5.73 (dt, 1H); d3.94 (t, 2H); δd 2.05 (dd, 3H); d1.76 (p, 2H); δd1.43 (p, 2H); 1.34-1.27 (m, 16H); d0.88 (t, 3H).

[Formula A]

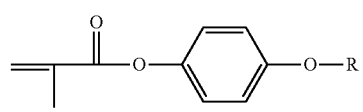

In Formula A, R is a linear alkyl group having 12 carbon atoms.

Preparation Example 2. Synthesis of Block Copolymer (A)

4.0 g of the monomer (A) of Preparation Example 1, 64 mg of cyanoisoproyl dithiobenzoate as an RAFT (reversible addition-fragmentation chain transfer) reagent, 23 mg of AIBN (azobisisobutyronitrile) as a radical initiator and 5.34 mL of benzene were placed in a 10 mL Schlenk flask and stirred at room temperature for 30 minutes under a nitrogen atmosphere, and then an RAFT (reversible addition-fragmentation chain transfer) polymerization reaction was performed at 70° C. for 4 hours. After the polymerization, the reaction solution was precipitated in 250 mL of methanol as an extraction solvent, and then filtered under reduced pressure and dried to prepare a pink macro initiator. The number average molecular weight (Mn) and the molecular weight distribution (Mw/Mn) of the macro initiator were 18,000 g/mol and 1.15, respectively.

0.3 g of the macro initiator, 5 g of a pentafluorostyrene monomer and 5 mL of benzene were placed in a 50 mL Schlenk flask and stirred at room temperature for 30 minutes under a nitrogen atmosphere, and then an RAFT (reversible addition-fragmentation chain transfer) polymerization reaction was performed at 115° C. for 4 hours. After the polymerization, the reaction solution was precipitated in 500 mL of methanol as an extraction solvent, and then filtered under reduced pressure and dried to prepare a pale pink block copolymer. The yield of the block copolymer was about 18 wt %, and the number average molecular weight (Mn) and the molecular weight distribution (Mw/Mn) were 40,000 g/mol and 1.11, respectively. The block copolymer comprises a polymer segment A derived from the monomer (A) of Preparation Example 1 and a polymer segment B derived from the pentafluorostyrene monomer.

Preparation Examples 3 to 7

Five kinds of block copolymers having different molecular weights were further prepared in the same manner as in Preparation Example 2 except for controlling the molar ratios of the monomer and the macro initiator, and the like. The characteristics of the macro initiator and the block copolymer used in each preparing process were summarized and described in Table 1 below.

TABLE 1

|  |  | Preparation Example | | | | | |
|---|---|---|---|---|---|---|---|
|  |  | 2 | 3 | 4 | 5 | 6 | 7 |
| Block copolymer |  | A | B | C | D | E | F |
| Macro initiator | Molecular weight (Mn) | 18 | 29 | 29 | 14 | 9 | 8 |
|  | Molecular weight distribution | 1.15 | 1.19 | 1.11 | 1.19 | 1.14 | 1.10 |
| Block copolymer | Molecular weight (Mn) | 40 | 53 | 73 | 30 | 19 | 21 |
|  | Molecular weight distribution | 1.11 | 1.15 | 1.15 | 1.22 | 1.20 | 1.12 |
|  | Volume fraction | 0.44 | 0.34 | 0.49 | 0.42 | 0.42 | 0.53 |

Molecular weight (Mn): number average molecular weight (unit: Kg/mol)
Molecular weight distribution (Mw/Mn): ratio (Mw/Mn) of weight average molecular weight (Mw) to number average molecular weight (Mn)
Volume fraction: volume fraction of polymer segment B (the total volume fraction of segments A and B is 1)

The block copolymers (A) to (D) prepared above all contain a side chain having 12 chain-forming atoms in the segment A (the R moiety of Formula A above). Furthermore, for each block copolymer, the value of n/D, that is, the numerical value calculated by $nq/(2\times\pi)$ in Equation 1 above (in Equation 1 above, n is the number of chain-forming atoms (12), q is the scattering vector value at which the peak with the largest peak area is identified in the scattering vector range of 5 $nm^{-1}$ to 10 $nm^{-1}$ the XRD analysis) was about 3.75 for all, the surface energy of the polymer segment A was about 30.83 mN/m in all the five block copolymers, and the surface energy of the polymer segment B was also about 24.4 mN/m in all the five block copolymers. In addition, the density of the polymer segment A was about 1 $g/cm^3$ in all the five block copolymers, and the density of the polymer segment B was about 1.57 $g/cm^3$.

Example 1

The block copolymer (A) of Preparation Example 2 and the block copolymer (E) of Preparation Example 6 were mixed to prepare a polymer composition. The specific compositions in the polymer composition were summarized and described in Table 2 below. Subsequently, a coating liquid prepared by diluting the polymer composition in toluene to a solid concentration of about 1.5 wt % was spin-coated on a substrate, dried at room temperature for about 1 hour, and then thermally annealed at a temperature of about 200° C. for about 10 minutes to form a self-assembled film. Here, as the substrate, a known silicon wafer without any neutral treatment on its surface was applied. An SEM (scanning electron microscope) image of the formed film was photographed. The FIGURE is an SEM image photographed in Example 1, and as confirmed from the drawing, it was confirmed that in the case of the polymer composition of Example 1, the vertically oriented self-assembled cylinder structure was effectively formed.

Examples 2 to 5 and Comparative Example 1

Polymer films were formed in the same manner as in Example 1, except that the types and ratios of the block copolymers applied upon preparing the polymer composition were changed as in Table 2 below, and the evaluation results thereof were summarized and described in Table 2 below.

TABLE 2

|  |  | Example | | | | | Comparative Example |
|---|---|---|---|---|---|---|---|
|  |  | 1 | 2 | 3 | 4 | 5 | 1 |
| Polymer composition | Fisrt BCP | A | B | C | B | C | C |
|  | Second BCP | E | E | E | F | D | — |
|  | Third BCP | — | — | — | — | E | — |
| Weight ratio |  | 1:1 | 1:1 | 1:1 | 1:1 | 2:1:1 | — |
| Molar ratio |  | 1:2.1 | 1:2.8 | 1:3.8 | 1:2.6 | 1:1.2:2.0 | 1 |
| VF |  | 0.43 | 0.36 | 0.46 | 0.42 | 0.35 | 0.49 |

TABLE 2-continued

|  | Example | | | | | Comparative Example |
|---|---|---|---|---|---|---|
|  | 1 | 2 | 3 | 4 | 5 | 1 |
| Phase separation | formed | formed | formed | formed | formed | unformed |
| Pitch | 30 nm | 35 nm | 42 nm | 37 nm | 45 nm | — |

First BCP: type of first block copolymer
Second BCP: type of second block copolymer
Third BCP: type of third block copolymer
Weight ratio: weight ratio of block copolymers (first BCP: second BCP or first BCP: second BCP: third BCP)
Molar ratio: molar ratio of block copolymers (first BCP: second BCP or first BCP: second BCP: third BCP)
VF: sum of polymer segments B in the polymer composition (based on 1 of the sum of polymer segments A and B)
Phase separation: whether or not a vertically oriented cylinder structure is formed in the same form as in Figure 1 of Example 1 (in the case of Comparative Example 1, a horizontal orientation lamellar structure is formed)
Pitch: distance between cylinder centers in vertically oriented cylinder structure (unit: nm)

The invention claimed is:

1. A method for producing a polymer film comprising forming a polymer film using a polymer composition comprising block copolymers, and inducing a cylinder structure of the block copolymers in the polymer film, wherein the block copolymers comprise a first block copolymer, and a second block copolymer having a number average molecular weight different from that of the first block copolymer, wherein both the first block copolymer and the second block copolymer have a polymer segment A and a polymer segment B, wherein the polymer segment A comprises a ring structure and a side chain having 8 or more chain-forming atoms, wherein the side chain is substituted on the ring structure via linker selected from an oxygen atom, a sulfur atom, —$NR_1$—, —$S(=O)_2$—, a carbonyl group, an alkylene group, an alkenylene group, an alkynylene group, —C(=O)—$X_1$— or —$X_1$—C(=O)—, wherein $R_1$ is hydrogen, an alkyl group, an alkenyl group, an alkynyl group, an alkoxy group or an aryl group, and $X_1$ is a single bond, an oxygen atom, a sulfur atom, —$NR_2$—, —$S(=O)_2$—, an alkylene group, an alkenylene group or an alkynylene group, where $R_2$ is hydrogen, an alkyl group, an alkenyl group, an alkynyl group, an alkoxy group or an aryl group, and wherein the polymer segment B comprises a ring structure wherein three or more halogen atoms are substituted on the ring structure.

2. The method for producing a polymer film according to claim 1, wherein the first block copolymer of the block copolymers in the polymer composition has the smallest number average molecular weight (M1) and the number average molecular weight (M1) is in a range of 5 to 60 Kg/mol.

3. The method for producing a polymer film according to claim 2, wherein the weight ratio of the first block copolymer based on the total weight of the block copolymers in the polymer composition is in a range of 10 wt % to 90 wt %.

4. The method for producing a polymer film according to claim 2, wherein the molar ratio of the first block copolymer based on the total mole number of the block copolymers in the polymer composition is in a range of 10 mol % to 90 mol %.

5. The method for producing a polymer film according to claim 1, wherein the second block copolymer of the block copolymers in the polymer composition has the largest number average molecular weight (M2) and the number average molecular weight (M2) is in a range of 10 to 100 Kg/mol.

6. The method for producing a polymer film according to claim 5, wherein the weight ratio of the second block copolymer based on the total weight of the block copolymers in the polymer composition is in a range of 10 wt % to 90 wt %.

7. The method for producing a polymer film according to claim 5, wherein the molar ratio of the second block copolymer based on the total mole number of the block copolymers in the polymer composition is in a range of 10 mol % to 90 mol %.

8. The method for producing a polymer film according to claim 1, wherein the ratio (M2/M1) of the number average molecular weight (M2) of the second block copolymer to the number average molecular weight (M1) of the first block copolymer is in a range of 1.2 to 10.

9. The method for producing a polymer film according to claim 1, wherein the difference (M2-M1) between the number average molecular weight (M1) of the first block copolymer and the number average molecular weight (M2) of the second block copolymer is 100 Kg/mol or less.

10. The method for producing a polymer film according to claim 1, wherein the polymer segment A satisfies any one condition of Conditions 1 to 3 below:

Condition 1: it exhibits a melting transition peak or an isotropic transition peak in a range of −80° C. to 200° C. in a differential scanning calorimetry (DSC) analysis:

Condition 2: it exhibits a peak having a half-value width in a range of 0.2 to 0.9 $nm^{-1}$ within a scattering vector (q) range of 0.5 $nm^{-1}$ to 10 $nm^{-1}$ in an X-ray diffraction (XRD) analysis:

Condition 3: it comprises a side chain, which satisfies Equation 1 below:

$$3 \text{ nm}^{-1} \text{ to } 5 \text{ nm}^{-1} = nq/(2 \times \pi)$$ [Equation 1]

wherein, n is a number of chain-forming atoms in the side chain and q is the smallest scattering vector in which a peak is observed in the XRD analysis for the block copolymer or the scattering vector in which a peak of the largest peak area is observed.

11. The method for producing a polymer film according to claim 10, wherein the absolute value of the difference in surface energy between the polymer segments A and B is in a range of 2.5 to 7 mN/m.

12. The method for producing a polymer film according to claim 1, wherein the sum of volume fractions of the polymer segment A in the polymer composition is in a range of 0.5 to 0.7, and the sum of volume fractions of the polymer segment A and the polymer segment B in the polymer composition is 1.

13. The method for producing a polymer film according to claim 1, wherein the chain-forming atoms are each independently a carbon, an oxygen, a sulfur or a nitrogen atom.

\* \* \* \* \*